(12) United States Patent
Thurgood

(10) Patent No.: US 7,078,823 B2
(45) Date of Patent: Jul. 18, 2006

(54) SEMICONDUCTOR DIE CONFIGURED FOR USE WITH INTERPOSER SUBSTRATES HAVING REINFORCED INTERCONNECT SLOTS

(75) Inventor: Blaine J. Thurgood, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/787,351

(22) Filed: Feb. 26, 2004

(65) Prior Publication Data

US 2004/0201075 A1    Oct. 14, 2004

Related U.S. Application Data

(62) Division of application No. 10/409,804, filed on Apr. 9, 2003.

(51) Int. Cl.
*H01I 23/48*    (2006.01)

(52) U.S. Cl. ............... 257/786; 257/776; 257/779; 257/780; 257/E23.018; 257/E23.2

(58) Field of Classification Search ............... 257/734, 257/735, 776, 779, 780, 781, 784, 786, E21.088, 257/E23.018, E23.2
See application file for complete search history.

(56) References Cited

U.S. PATENT DOCUMENTS

| | | | |
|---|---|---|---|
| 3,635,124 A | 1/1972 | Parsons | |
| 5,231,878 A | 8/1993 | Zanini-Fisher et al. | |
| 5,313,096 A | 5/1994 | Eide | |
| 5,384,689 A | 1/1995 | Shen | |
| 5,514,905 A * | 5/1996 | Sakuta et al. | 257/666 |
| 5,567,655 A * | 10/1996 | Rostoker et al. | 438/123 |
| 5,589,420 A * | 12/1996 | Russell | 438/123 |
| 5,597,643 A | 1/1997 | Weber | |
| 5,661,336 A | 8/1997 | Phelps, Jr. et al. | |
| 5,723,907 A | 3/1998 | Akram | |
| 5,739,585 A | 4/1998 | Akram et al. | |
| 5,818,698 A | 10/1998 | Corisis | |
| 6,078,104 A | 6/2000 | Sakurai | |
| 6,091,140 A * | 7/2000 | Toh et al. | 257/691 |
| 6,122,171 A | 9/2000 | Akram et al. | |
| 6,177,723 B1 * | 1/2001 | Eng et al. | 257/691 |
| 6,190,943 B1 | 2/2001 | Lee et al. | |
| 6,300,165 B1 | 10/2001 | Castro | |
| 6,303,948 B1 * | 10/2001 | Kudou et al. | 257/207 |
| 6,344,976 B1 * | 2/2002 | Schoenfeld et al. | 361/813 |
| 6,370,767 B1 | 4/2002 | Solberg et al. | |
| 6,531,335 B1 | 3/2003 | Grigg | |
| 6,531,785 B1 * | 3/2003 | Shimizu et al. | 257/786 |

(Continued)

FOREIGN PATENT DOCUMENTS

JP    04142095 A    5/1992

(Continued)

*Primary Examiner*—Jasmine Clark
(74) *Attorney, Agent, or Firm*—TraskBritt

(57) ABSTRACT

A board-on-chip (BOC) semiconductor package includes a multisegmented, longitudinally slotted interposer substrate through which an elongate row of die bond pads is accessed for electrical attachment, as by wire bonding, to conductive traces on the opposite side of the interposer substrate. One or more reinforcements in the form of crosspieces or bridges span and segment intermediate portions of the interposer substrate slot to resist bending stresses acting in the slot region proximate the centerline of the interposer substrate tending to crack or delaminate a polymer wire bond mold cap filling and covering the slot and the wire bonds. Various interposer substrate configurations are also disclosed, as are methods of fabrication.

5 Claims, 4 Drawing Sheets

U.S. PATENT DOCUMENTS

| | | |
|---|---|---|
| 6,700,983 B1 * | 3/2004 | Bøgeskov-Jensen et al. ..... 381/322 |
| 6,720,666 B1 | 4/2004 | Lim et al. |
| 2001/0012643 A1 | 8/2001 | Asada |
| 2002/0008307 A1 | 1/2002 | Dickey |
| 2002/0020689 A1 | 2/2002 | Leung |
| 2002/0072148 A1 * | 6/2002 | Chen .......................... 438/108 |
| 2002/0172024 A1 | 11/2002 | Hui et al. |
| 2003/0132518 A1 | 7/2003 | Castro |

FOREIGN PATENT DOCUMENTS

| | | |
|---|---|---|
| JP | 10308467 A | 11/1998 |

* cited by examiner

SEMICONDUCTOR DIE CONFIGURED FOR USE WITH INTERPOSER SUBSTRATES HAVING REINFORCED INTERCONNECT SLOTS

CROSS-REFERENCE TO RELATED APPLICATION

This application is a divisional of application Ser. No. 10/409,804, filed Apr. 9, 2003, pending.

BACKGROUND OF THE INVENTION

1. Field of the Invention

The present invention relates generally to fabrication of semiconductor devices and, more specifically, to the packaging of semiconductor dice.

2. State of the Art

In the field of semiconductor device manufacture, testing and packaging of various types of semiconductor dice are conducted in a similar manner. Thus, conventional dynamic random access memory dice (DRAMs), static random access memory dice (SRAMs), programmable memory dice (PROMs, EPROMs, EEPROMs, flash memories), logic dice, and microprocessor dice are fabricated, tested and packaged in a generally similar manner.

Following fabrication of a plurality of dice on a wafer or other bulk substrate of semiconductor material, a preliminary test for functionality is conducted on each die, such as by probe testing. The dice are then singulated, and those passing the functionality test are picked from the wafer, typically for packaging, such as by transfer molding, and subsequent incorporation into a higher-level assembly. Typically, each die is formed with one or more rows of bond pads on the active surface. The bond pad row or rows may be formed along a central axis of the die or along one or more peripheral portions thereof. Transfer molded packages may comprise bond wires which electrically couple bond pads on the die to leads of a lead frame, the outer ends of the leads extending beyond the protective encapsulant, which is typically a silicone-filled, thermoplastic polymer. The lead frame leads are used to achieve mechanical and electric connection of the die to a carrier substrate such as a printed circuit board (PCB), for example.

Following packaging, the packaged die may be characterized for compliance with selected electrical parameters under various environmental conditions. Those which fail the testing are scrapped or, in some instances, may be reworked for compliance using redundant circuitry incorporated into the die.

The foregoing traditional approach to packaging has a number of shortcomings. For example, the resulting package may be much larger than the enclosed die, requiring an undue amount of space or "real estate" on a carrier substrate. In addition, the insulative value of the large mass of encapsulant material of the package inhibits heat transfer from the die, which may cause die malfunction or failure over time. The packaging process is very materials-intensive and requires a substantial number of steps, including adherence of the die to a lead frame of a lead frame strip, wire bonding, placement in a transfer mold cavity and removal therefrom, followed by a trim and form operation to sever the package leads from the lead frame and deform the outer lead ends for connection to higher-level packaging. Furthermore, this type of packaging is somewhat limiting (absent somewhat exotic lead frame design approaches) in terms of the number of available I/O connections, presenting a problem as the number of required connections per die increases.

A board-on-chip (BOC) semiconductor package has also been developed, in which an interposer substrate such as a relatively small, slightly larger than die-size interposer substrate is formed with a centrally placed, elongate through-slot sized and configured for alignment with a row or rows of bond pads on the die. The through-slot is also known as an "interconnect slot" or "wire bond slot." The die is adhesively joined by its active surface to one side of the interposer substrate such that the bond pads are accessible through the interconnect slot. The bond pads are connected to conductive traces on the opposite side of the interposer substrate, by bond wires, for example, which pass through the interconnect slot. The interconnect slot is then filled with a silicone-filled, thermoplastic polymer encapsulant to encase and seal the bond wires and surrounding, exposed portion of the die's active surface. Conventionally, a transfer molding process is used to form this wire bond mold cap while simultaneously encapsulating the back side and sides of the die on the opposite side of the interposer substrate. A ball grid array (BGA) or other type of array of discrete conductive elements electrically connected to the conductive traces and projecting from the side of the interposer substrate with the wire bond cap may be used to mechanically and electrically connect the package to a carrier substrate or other higher-level packaging. Various examples of this type of package construction are shown in U.S. Pat. Nos. 5,723,907 to Akram and 5,739,585 to Akram et al., and U.S. Pat. No. 5,818,698 to Corisis, all of which patents are assigned to the assignee of the present application and the disclosure of each of which is incorporated by reference herein. The resulting package has a much reduced size, which may be termed "chip scale" or "near chip scale," and is generally capable of establishing robust, high-quality mechanical and electrical connections using conventional bonding techniques.

Various aspects of the general concept of the above-described type of package are also shown in U.S. Pat. No. 5,313,096 to Eide, U.S. Pat. No. 5,384,689 to Shen, U.S. Pat. No. 5,661,336 to Phelps, Jr. et al., and U.S. Pat. No. 6,190,943 B1 to Lee et al.

Despite the obvious advantages for this BOC-type of semiconductor package, a problem has been repeatedly noted relative to the integrity of the wire bond mold cap. Stress cracking of the wire bond mold cap has been found to occur at an unacceptably high frequency in certain package configurations. The undesirable stress cracking has been found to be attributable to tensile stresses induced in the interconnect or wire bond slot region during temperature cycling, thermal shock, curing in the mold during the encapsulation process, etc., as the package interposer substrate is cycled between compressive and tensile stress states. This cycling is due in large part to the disparity of encapsulant volume on opposing sides of the interposer substrate and the associated stress cracking to reduced rigidity against bending of the interposer substrate due to the presence of the interconnect or wire bond slot extending along a majority of the centerline or longitudinal axis of the interposer substrate.

The aforementioned stress cracking in conventional BOC-type packages has been found to be largely concentrated at the interface between the interconnect slot edge and the mold cap itself. It has been recognized by those skilled in the art that the frequency of occurrence and magnitude of this problem is greater where the length of the elongated, central interconnect slot is a major portion of the corresponding substrate length. In BOC-type packages having an interposer substrate with an interconnect slot, the interconnect slot length is typically about 70 to 80% of the corresponding substrate length. It has been estimated that an unacceptably high failure rate generally occurs where the slot length is about 67% or more of the substrate length (for a bismaleimide triazine (BT) resin substrate). Thus, the problem may be very pervasive, as such relative slot lengths are quite common and necessary to accommodate the large number of bond pads required for operation of state of the art dice. Where the interposer substrate comprises another material, such as a ceramic for example, the critical ratio of slot length to substrate length may be somewhat different.

The present invention is directed to effectively resolving the foregoing problem in an economic manner using conventional components and packaging techniques.

BRIEF SUMMARY OF THE INVENTION

The present invention, in one embodiment, comprises a reinforced interposer substrate configuration for a board-on-chip (BOC) and other similar semiconductor packages. In such packages, a segmented, elongate interconnect aperture (i.e., slot) is formed in the interposer substrate and permits interconnection of die bond pads with conductors on the opposite side of the substrate by bond wires or other intermediate conductive elements. The present invention provides resistance to thermally induced cracking of the package adjacent the interconnect apertures during temperature cycling, thermal shock, mold cure, and other thermal initiators of stress state cycling which subject the interposer substrate to unacceptably high levels of tensile stress.

In another embodiment, the present invention comprises interposer substrates for BOC-type packaging incorporating one or more crosspieces or bridges transversely spanning an elongate interconnect slot therein, forming a segmented interconnect slot reinforced against bending stresses. Each crosspiece or bridge joins the opposed slot walls or edges to provide added strength and rigidity against bending to the interposer substrate. As a result, tensile stresses applied under thermal cycling of the package by the encapsulant material to the interposer substrate acting between and adjacent the interconnect slot walls are resisted, preventing excessive yielding of the interposer substrate and preventing cracking or delamination of the polymer wire bond mold cap adjacent the interconnect slot. Thus, thermal stress cracking in the polymer wire bond mold cap is greatly reduced or eliminated.

The present invention, in yet another embodiment, also comprises BOC-type semiconductor die packages incorporating an interposer substrate having one or more crosspieces or bridges extending across an interconnect slot to form a segmented interconnect slot, semiconductor dice configured for use with the interposer substrate of the present invention and a method of fabrication of interposer substrates according to the present invention.

BRIEF DESCRIPTION OF THE SEVERAL VIEWS OF THE DRAWINGS

The nature of the present invention as well as other embodiments thereof may be more clearly understood by reference to the following detailed description of the invention in conjunction with the several drawings herein, wherein elements and features depicted therein are identified with similar reference numerals.

DETAILED DESCRIPTION OF THE INVENTION

Figure 1:
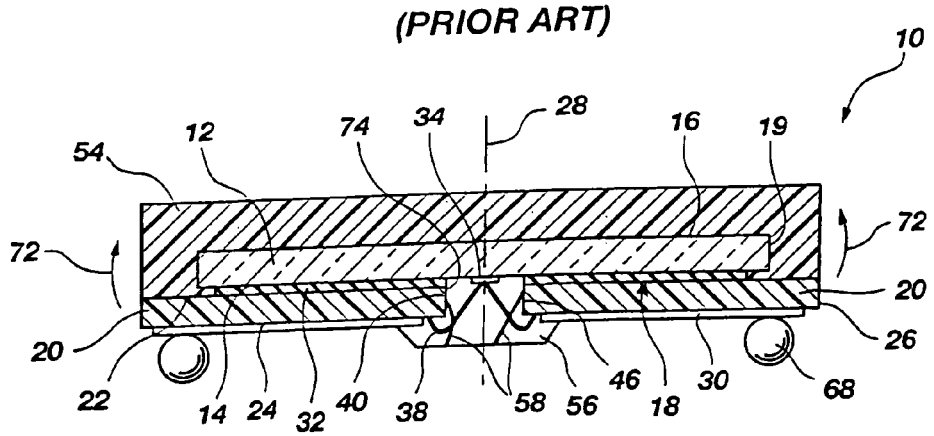
FIG. 1 is a cross-sectional end view of an exemplary BOC semiconductor package of the prior art having an elongate interconnect slot.

In use and operation, and referring to FIG. 1, an exemplary BOC semiconductor package 10 of the prior art is depicted. The semiconductor chip or die 12 has an active surface 14 and a back surface 16. The die 12 is shown with a plurality of bond pads 34 disposed on the active surface 14, in one or more mutually parallel, generally linear rows 36 (see FIG. 4) along a centerline bisecting the active surface 14. Generally, the bond pads 34 have a uniform interpad spacing or pitch 8 (see FIG. 4).

As shown in FIG. 1, the package 10 includes an interposer substrate 20 such as may be formed of a sheet of circuit board material such as a BT resin or epoxy-glass composite, or may comprise silicon (with a passivated surface), ceramic or other suitable dielectric material. The interposer substrate 20 has an interconnect or wire bond slot 40 corresponding to the position of the central row or rows 36 of bond pads 34 (FIG. 4) and exposing bond pads 34 therethrough. In addition, conductive traces 30 are typically formed on the surface 24 of interposer substrate 20 and extend from locations adjacent interconnect slot 40 to other, more remote locations on surface 24. The conductive traces 30 are connected through interconnect slot 40 to the bond pads 34 by elongated conductive elements in the form of bond wires 38. Conductive traces 30 are also connected to discrete conductive elements 68 of a ball-grid-array (BGA) comprising solder balls or conductive or conductor-filled or coated columns, pillars or studs, enabling attachment of the package 10 to a carrier substrate (not shown) such as a circuit board of an electronic system such as a computer.

In FIG. 1, die 12 is shown as having its active surface 14 mounted on a die attachment area 18 on the surface 22 of interposer substrate 20 by adhesive material 32. The adhesive material 32 may comprise one of many suitable adhesives such as thermoplastic adhesive, a thermoset adhesive or one or more tape or film segments such as a polyimide (e.g., Kapton tape®) having a pressure-sensitive adhesive on both sides thereof.

As shown, the package 10 includes a molded filled polymer body 54 extending over the back surface 16 and lateral edges 19 of the die 12 to surface 22 of interposer substrate 20. As shown, the molded filled polymer body 54 may extend to the peripheral edges 26 of interposer substrate 20, but this is not required. In addition, a filled polymer wire bond mold cap 56 is formed to fill the interconnect slot 40 and cover the bond wires 38, including the bond sites to conductive traces 30. Typically, the molded filled polymer body 54 and filled polymer wire bond mold cap 56 are formed substantially simultaneously by conventional transfer molding techniques which are well-known in the electronic industry. Alternatively, other packaging methods may be used, including pot molding and injection molding, for example.

Figure 3:
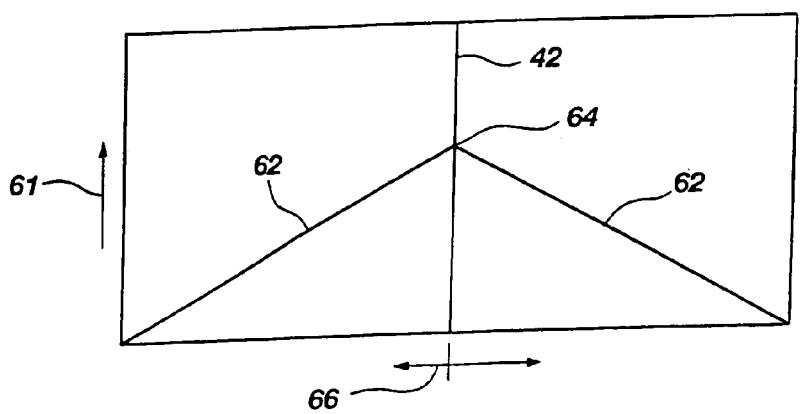
FIG. 3 is a schematic view of tensile bending stresses exerted on a BOC semiconductor package such as the prior art semiconductor package of FIG. 1 as a function of lateral distance from the centerline thereof.

FIG. 1 also illustrates bending stresses 72 which occur when the package 10 is subjected to temperature cycling and thermal shock. The interposer substrate 20 is thus cycled back and forth between compressive and tensile stress conditions. When in a tensile state, the bending stresses 72 act on the wire bond mold cap 56 and the edges 46 of the interconnect slot 40, tending to separate them. Cracks 58 propagate at the interface 74 between the mold cap 56 and edges 46, or within the mold cap 56 itself, to relieve the applied tensile stress. Breakage of bond wires 38 lying in the path of a crack 58 may also occur. As depicted in the generalized graph of FIG. 3, the stress values 61 (whether tensile or compressive) increase as shown at 62 toward the center of interposer substrate 20 and attain peak values 64 generally along the centerline 42 of the interposer substrate 20. Conversely, stress levels decrease with distance 66 from the centerline 42 of interposer substrate 20. Of course, it is the occurrence of peak values 64 for stress, which causes the aforementioned damage in the interconnect slot 40 region of interposer substrate 20.

Figure 2:
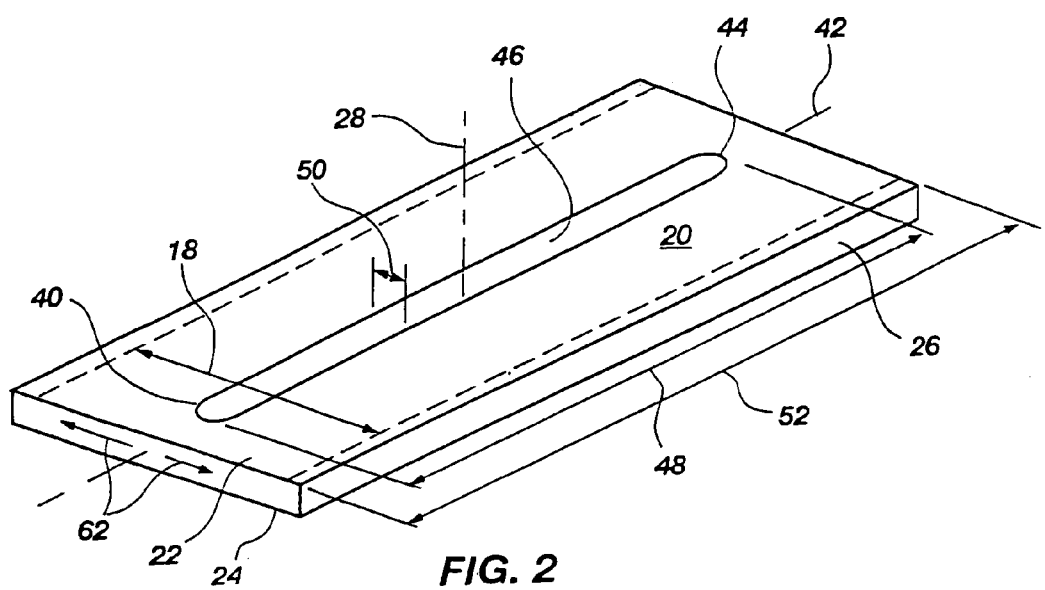
FIG. 2 is a perspective view of an exemplary prior art interposer substrate of the BOC semiconductor package of FIG. 1.

FIG. 2 depicts the exemplary interposer substrate 20 of FIG. 1. Interposer substrate 20 is shown in this embodiment as a planar member with a surface 22 and an opposed surface 24. The interposer substrate 20 has a length 52. A die 12 (not shown in FIG. 2) with a central row 36 of bond pads 34 will be attached to die attachment area 18 on the surface 22 such that the bond pads 34 will be exposed through the interconnect slot 40. Conductive traces 30 (not shown in FIG. 2) are formed on the surface 24, as already discussed. As shown, the interconnect slot 40 has a length 48 which, in many instances, is about 70–80% of the interposer substrate 20 length 52 so as to extend a length at least slightly greater than the row or rows 36 of centrally placed bond pads 34 of the die 12 with which interposer substrate 20 is assembled. The slot width 50 is typically made as narrow as possible because of the required space for conductive traces 30 on the outer surface 24 of interposer substrate 20, but is required to be of sufficient width to accommodate a wire bond capillary used to place bond wires 38 and therefore, form bonds with bond pads 34 and the ends of conductive traces 30 adjacent interconnect slot 40. Also shown are vertical axis 28 oriented perpendicular to the plane of interposer substrate 20 through the interconnect slot 40 and longitudinal axis or centerline 42 extending through the interconnect slot 40 in the plane of interposer substrate 20. The interconnect slot ends 44 are typically rounded or filleted, a natural consequence of slot formation in the interposer substrate 20 by milling. Rounded slot ends as illustrated in FIG. 2, therefore, have a greater strength than, e.g., squared ends, the corners of which are subject to crack initiation and propagation.

Figure 4:
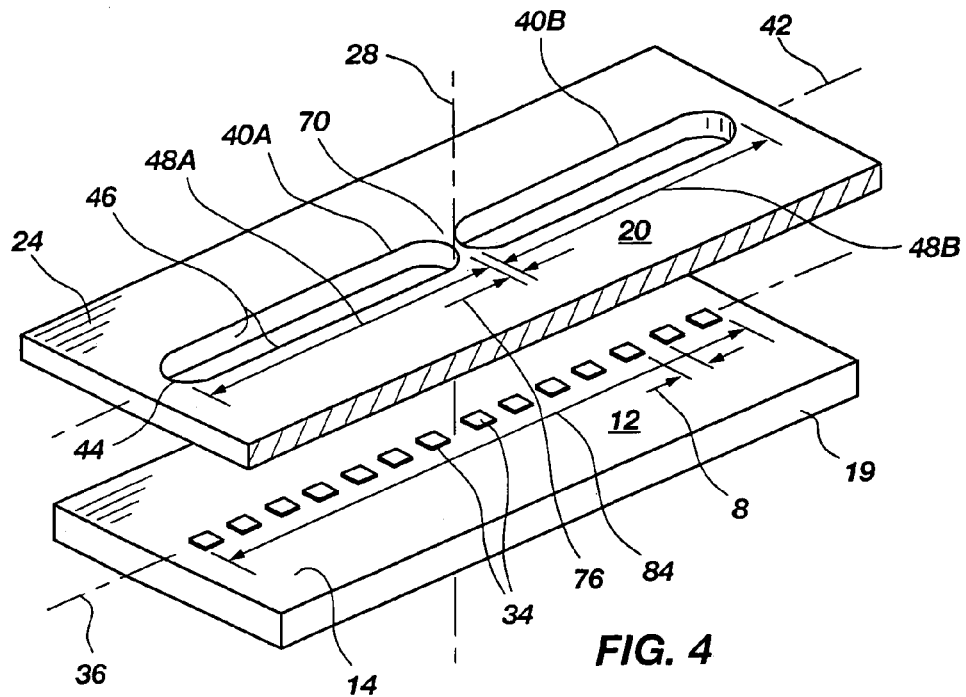
FIG. 4 is an exploded perspective view of an exemplary die and one embodiment of a matching reinforced interposer substrate in a BOC package in accordance with the present invention.
Figure 9:
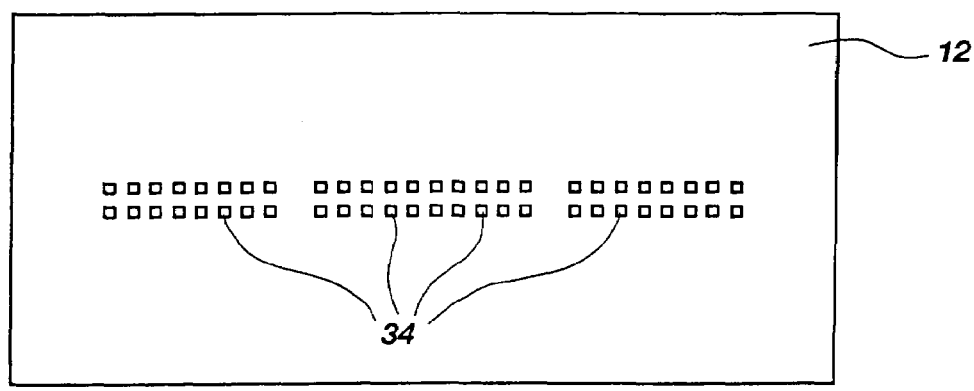
FIG. 9 is a top view of a semiconductor die having a plurality of groups of bond pads on the active surface thereof, the groups being longitudinally spaced by a distance greater than individual bond pad spacing within a group.
Figure 9A:
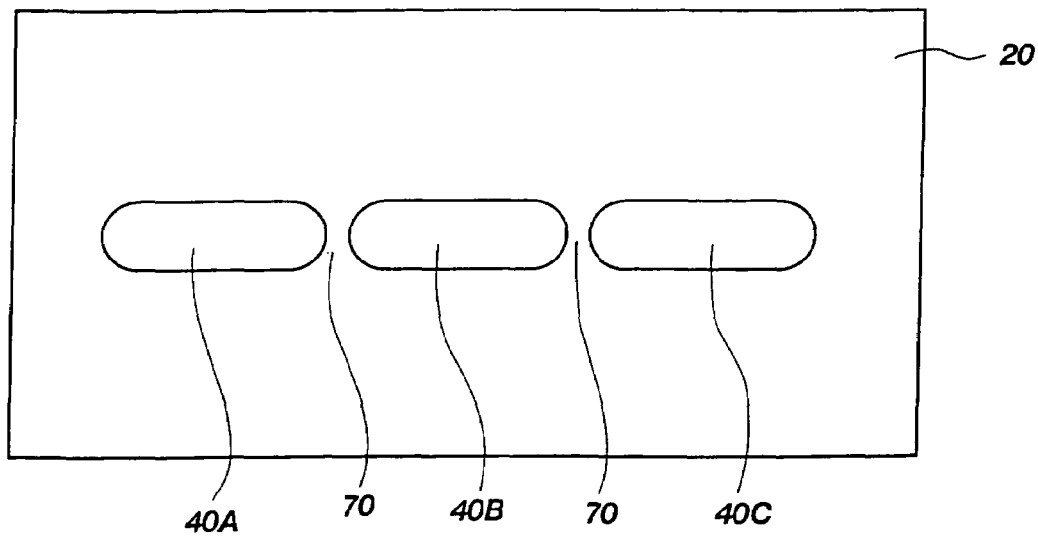
FIG. 9A is a top view of an interposer substrate configured with a plurality of crosspieces or bridges for use with the semiconductor die of FIG. 9.

In the present invention, one or more crosspieces or bridges 70 (FIG. 4) are formed between the slot ends 44 of the elongate interconnect slot 40. These crosspieces or bridges provide a multisegmented interconnect slot 40 and reinforce the interposer substrate 20 between the opposing edges 46 of the interconnect slot 40 at intermediate locations along the interconnect slot 40 against bending attributable to stresses applied thereto. Turning now to FIG. 4, one exemplary embodiment of the interposer substrate 20 of the invention is shown, together with a die 12 with a single central row 36 of bond pads 34. A crosspiece or bridge 70 comprises a filleted portion of the interposer substrate 20 which is left uncut during manufacture, i.e:, two longitudinally adjacent interconnect slots or slot segments 40A, 40B are formed in interposer substrate 20 instead of a single interconnect slot 40 (as depicted in FIGS. 1 and 2), leaving crosspiece or bridge 70 in place. The interconnect slot segments 40A, 40B of the present invention are shown with a combined length of 48A plus 48B, which is slightly less than the length 48 of a single prior art interconnect slot 40 for a similarly sized interposer substrate 20. However, the longitudinal distal end-to-distal end length of the two interconnect slot segments 40A, 40B may be equivalent to, or even longer than, that of a single prior art interconnect slot 40. The width 76 of the crosspiece or bridge 70 in the direction of centerline 42 is small, generally about 0.5 mm or more for a BT resin interposer substrate 20 given manufacturing tolerances, yet sufficient to extend between longitudinally adjacent bond pads 34. It may be desirable to space bond pads 34 into two or more longitudinally adjacent groups with increased interpad spacing or pitch 8 between groups of the plurality of bond pads 34, as depicted in FIG. 9, to enable the use of larger-width crosspieces or bridges 70. If necessary, more than one crosspiece or bridge 70 may be used, generally evenly spaced along the interconnect slot 40 (see slot segments 40A, 40B and 40C in FIG. 9A), to divide the interconnect slot 40 into three or even more segments to provide a required resistance to bending. Generally, however, for overall length 84 of the row 36 of bond pads 34 for dice 12 of about 3 to 15 mm in length, a single, substantially centrally placed crosspiece or bridge 70 is sufficient to avoid stress cracking or delamination of the wire bond mold cap 56. For longer dice 12, two or more longitudinally spaced crosspieces or bridges 70 may be desirable to thereby avoid stress cracking or delamination of the wire bond mold cap 56.

Figure 8:
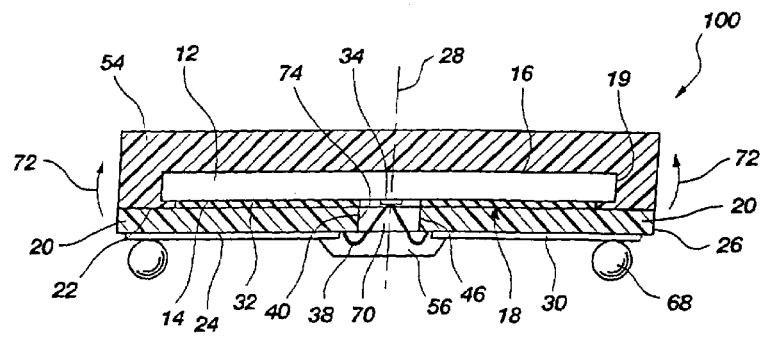
FIG. 8 is a cross-sectional end view of a BOC semiconductor package having a reinforced interposer substrate according to the present invention, taken slightly longitudinally offset from the midpoint of the interconnect slot.

Referring now to FIG. 8, a cross-sectional end view of a BOC semiconductor package 100 according to the present invention is illustrated. Elements and features of semiconductor package 100 are substantially the same as those of BOC semiconductor package 10, however, a notable addition to semiconductor package 100 is the transverse extension of crosspiece or bridge 70 across interconnect slot 40, thereby dividing interconnect slot 40 into slot segments 40A and 40B (see FIG. 4).

Figure 5:
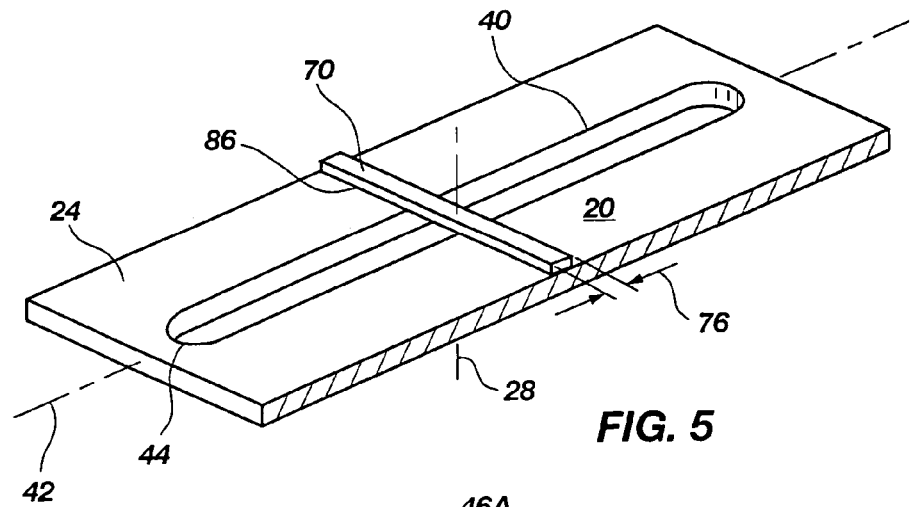
FIG. 5 is a perspective view of another embodiment of a reinforced interposer substrate for a BOC package in accordance with the present invention.

FIG. 5 illustrates another embodiment of a crosspiece or bridge 70. In this version, the crosspiece or bridge 70 comprises a narrow segment of material which is adhered by its underside 86 to surface 24 of interposer substrate 20 with a high-strength adhesive. This crosspiece or bridge 70 may be formed of a high-strength material with a coefficient of thermal expansion (CTE) approximating the CTE of the interposer substrate 20. For example, a reinforced polymer (such as a glass-reinforced polymer) may be used to form a thin crosspiece or bridge 70 having a minimum width 76 of about 0.5 mm. Other reinforced materials such as a polyimide tape, a ceramic element or a silicon-type element may be used.

Figure 5A:
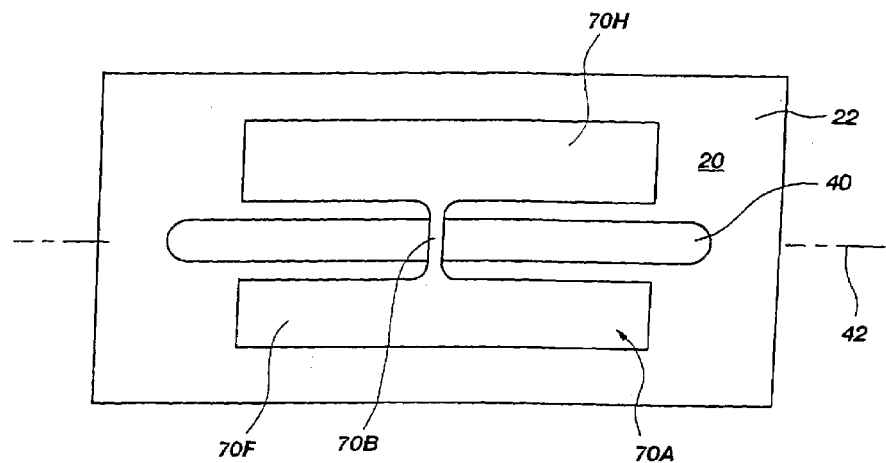
FIG. 5A is a top elevational view of a variation of the reinforced interposer substrate of FIG. 5.

It is also contemplated, as illustrated in FIG. 5A, that a laterally elongated "I"-shaped segment 70A bearing adhesive material 32 on both sides thereof and used for mounting a die 12 to interposer substrate 20 may be formed such as by die-cutting from a larger sheet of reinforced polymer, for example, and placed on surface 22 of interposer substrate 20 with the head 70H and foot 70F of the "I"-shaped segment 70A lying on opposing sides of an interconnect slot 40 and the body 70B of the "I"-shaped segment 70A forming the reinforcing crosspiece or bridge 70 thereacross. Of course, segment 70A may also be formed with two or more crosspieces to extend at intervals across interconnect slot 40, or two or more "I"-shaped segments 70A employed. Segment 70A may comprise, for example, a tape segment or a relatively stiff plastic segment.

Figure 6:
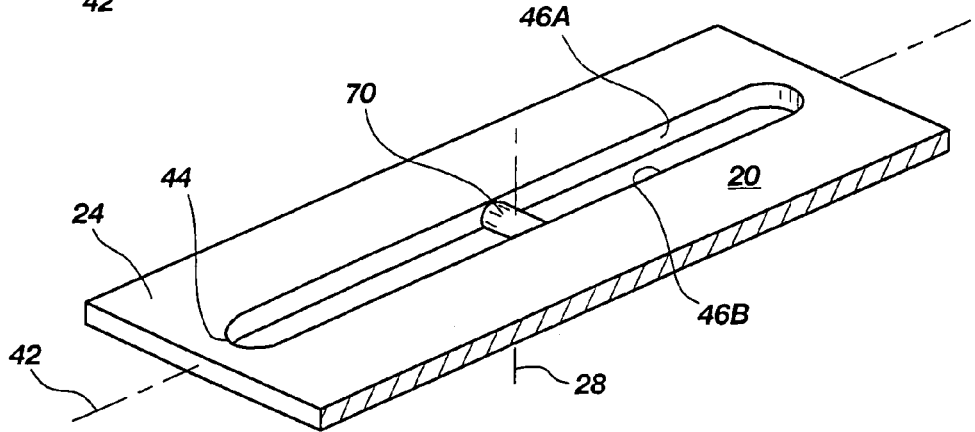
FIG. 6 is a perspective view of a further embodiment of a reinforced interposer substrate for a BOC package in accordance with the present invention.

FIG. 6 depicts a further embodiment of a crosspiece or bridge 70 which comprises a narrow plug or bar of material joined to each of the opposed slot edges 46A and 46B, preferably by a high-strength adhesive. This narrow plug or bar of material is preferably a dielectric material with sufficient strength to accommodate the compressive and tensile stresses applied along the opposed slot edges 46A and 46B, respectively. The various types of materials which may be used to form the plug or bar include, for example, glass, rigid plastic and ceramic.

Figure 7:
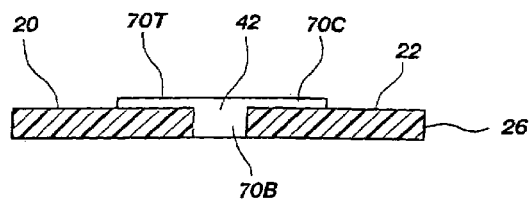
FIG. 7 is a side-sectional view of yet another embodiment of a reinforced interposer substrate in accordance with the present invention.

FIG. 7 depicts yet another embodiment of the present invention, in which a "T"-shaped crosspiece or bridge 70T is placed with its body 70B snugly placed in interconnect slot 40 and the legs of cap 70C extending over surface 22 transversely to centerline 42, both body 70B and cap 70C being adhesively bonded to interposer substrate 20.

As noted above, for dice 12 which may normally have an interpad spacing or pitch 8 (see FIG. 4) less than about 0.5 mm, the die design to accommodate any of the foregoing embodiments of the present invention may require a slightly larger bond pad spacing at one or several locations along the row 36 of bond pads 34. Thus, for example, a die 12 may be formed with a bond pad spacing of 0.4 mm along 95% of the row 36 of bond pads 34, while the spacing between two adjacent centrally located bond pads 34 is increased to 0.6 mm. Thus, a crosspiece or bridge 70 may be accommodated without significantly changing the overall length 84 of the row 36 of bond pads 34. Such an arrangement of bond pads 34 on a die 12 in the form of three groups of bond pads 34, each group of bonding pads 34 comprising two parallel rows flanking the centerline of the die 12, is illustrated in FIG. 9. However, in the embodiments of FIGS. 5, 5A, 6 and 7, it should be noted that use of a crosspiece or bridge 70 of a higher strength against bending than the material of interposer substrate 20 may enable the use of a thinner crosspiece or bridge 70 which may accommodate existing bond pad spacing or pitch 8. Similarly, if an appropriate material is selected for interposer substrate 20 and stringent manufacturing tolerances may be held, a thin yet effective crosspiece or bridge 70 may provide adequate resistance to bending stresses while still accommodating existing bond pad spacing or pitch 8.

While not specifically illustrated, it should be noted that the invention encompasses various combinations of the embodiments discussed and illustrated above, including stacked packages thereof.

In the discussion thus far, it is noted that the dice 12 are disposed on a planar surface 22 of the interposer substrate 20. However, the present invention is applicable to semiconductor packages in which the interposer substrate 20 or a base comprising the interposer substrate 20 has a die-receiving cavity and/or a conductor-carrying cavity on a surface 22 or an opposed surface 24 thereof.

It will be recognized from the above description that the segmentation for reinforcement of interconnect slots 40 in BOC semiconductor packages through the use of crosspieces or bridges 70 enhances the functionality and reliability of such semiconductor packages.

While the present invention has been disclosed herein in terms of certain exemplary embodiments, those of ordinary skill in the art will recognize and appreciate that it is not so limited. Many additions, deletions and modifications to the disclosed embodiments may be effected without departing from the scope of the invention. Moreover, elements and features from one embodiment may be combined with features from other embodiments. The scope of the present invention is defined by the claims which follow herein.

What is claimed is:

1. A semiconductor die having a bond pad arrangement thereon to facilitate packaging thereof, comprising:
   a rectangular body having an active surface and a longitudinal centerline; and
   a plurality of bond pads disposed adjacent the longitudinal centerline, wherein the plurality of bond pads has a longitudinal length along the longitudinal centerline determined by a longitudinal extent of the plurality of bond pads if equidistantly spaced in a given number of at least one longitudinal row, and wherein the plurality of bond pads are arranged in a same number of longitudinal rows as the given number and comprising at least two longitudinally adjacent groups of bond pads, each bond pad within a group of bond pads being longitudinally separated from adjacent bond pads within the same group of bond pads by an equal interpad spacing of less than an interpad spacing if all of the bond pads of the plurality were equidistantly spaced, each group of bond pads being separated from at least one longitudinally adjacent group of bond pads by an intergroup spacing of greater than the equal interpad spacing,
   wherein a longitudinal length of the at least two groups of bond pads and an intergroup spacing therebetween is substantially the same as the longitudinal length along the longitudinal centerline determined by a longitudinal extent of the plurality of bond pads if equidistantly spaced.

2. The semiconductor die of claim 1, wherein the at least two longitudinally adjacent groups of bond pads consists of two longitudinally adjacent groups.

3. The semiconductor die of claim 1, wherein the at least one longitudinal row comprises two longitudinal rows flanking the longitudinal centerline.

4. The semiconductor die of claim 1, wherein the intergroup spacing is about 1.5 times the interpad spacing.

5. The semiconductor die of claim 4, wherein the interpad spacing is about 0.4 mm and the intergroup spacing is about 0.6 mm.

* * * * *

UNITED STATES PATENT AND TRADEMARK OFFICE
CERTIFICATE OF CORRECTION

PATENT NO. : 7,078,823 B2  Page 1 of 1
APPLICATION NO. : 10/787351
DATED : July 18, 2006
INVENTOR(S) : Blaine J. Thurgood It is certified that error appears in the above-identified patent and that said Letters Patent is hereby corrected as shown below:

On the title page:
In the section (56) titled References Cited
U.S. PATENT DOCUMENTS 2nd page, 1st COLUMN, 1st entry,   delete "6,700,983 B1 *  3/2004 Bøgeskov-Jensen et al. ..... 381/222"

2nd page, 1st COLUMN, after 2nd entry,   on the line after "6,720,666 B1  4/2004 Lim et al."
insert --6,740,983 B2  3/2004  Tay et al.--

In the specification:
COLUMN 6, LINE 6,   change "slot ends as" to --slot ends 44 as--
COLUMN 7, LINE 55,   change "bonding pads 34" to --bond pads 34--

Signed and Sealed this

Thirtieth Day of October, 2007

JON W. DUDAS
*Director of the United States Patent and Trademark Office*